(12) United States Patent
Zhuang et al.

(10) Patent No.: US 9,812,324 B1
(45) Date of Patent: Nov. 7, 2017

(54) METHODS TO CONTROL FIN TIP PLACEMENT

(71) Applicant: GLOBALFOUNDRIES Inc., Grand Cayman (KY)

(72) Inventors: Lei Zhuang, Ridgefield, CT (US); Lars Liebmann, Mechanicville, NY (US); Stuart A. Sieg, Albany, NY (US); Fee Li Lie, Albany, NY (US); Mahender Kumar, Fishkill, NY (US); Shreesh Narasimha, Beacon, NY (US); Ahmed Hassan, Clifton Park, NY (US); Guillaume Bouche, Albany, NY (US); Xintuo Dai, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/405,789

(22) Filed: Jan. 13, 2017

(51) Int. Cl.
| | |
|---|---|
| *H01L 21/02* | (2006.01) |
| *H01L 21/76* | (2006.01) |
| *H01L 21/30* | (2006.01) |
| *H01L 21/027* | (2006.01) |
| *H01L 29/66* | (2006.01) |
| *H01L 27/02* | (2006.01) |
| H01L 21/8234 | (2006.01) |
| H01L 21/762 | (2006.01) |
| H01L 21/308 | (2006.01) |
| H01L 21/28 | (2006.01) |
| H01L 21/3065 | (2006.01) |

(52) U.S. Cl.
CPC ...... *H01L 21/0273* (2013.01); *H01L 27/0207* (2013.01); *H01L 29/66545* (2013.01); *H01L 29/66795* (2013.01); H01L 21/28123 (2013.01); *H01L 21/3065* (2013.01); *H01L 21/3086* (2013.01); *H01L 21/76224* (2013.01); *H01L 21/823431* (2013.01)

(58) Field of Classification Search
CPC ......... H01L 21/823431; H01L 21/3086; H01L 21/76; H01L 21/28123; H01L 21/3065; H01L 21/76224; H01L 21/823821; H01L 21/308
USPC ....................................................... 438/795
See application file for complete search history.

(56) References Cited

U.S. PATENT DOCUMENTS

2014/0131813 A1\* 5/2014 Liaw ................... H01L 27/1104
257/401

\* cited by examiner

*Primary Examiner* — Caleen Sullivan
(74) *Attorney, Agent, or Firm* — Heslin Rothenberg Farley & Mesiti P.C.

(57) ABSTRACT

A method includes providing a semiconductor structure having a substrate including a longitudinally extending plurality of fins formed thereon. A target layout pattern is determined, which overlays active areas devices disposed on the fins. The target layout pattern includes a first group of sections overlaying devices having more fins than adjacent devices and a second group of sections overlaying devices having less fins than adjacent devices. A first extended exposure pattern is patterned into the structure, and includes extensions that extend sections of the first group toward adjacent sections of the first group. A second extended exposure pattern is patterned into the structure, and includes extensions that extend sections of the second group toward adjacent sections of the second group. Portions of the first and second extended exposure patterns are combined to form a final pattern overlaying the same active areas as the target pattern.

14 Claims, 14 Drawing Sheets

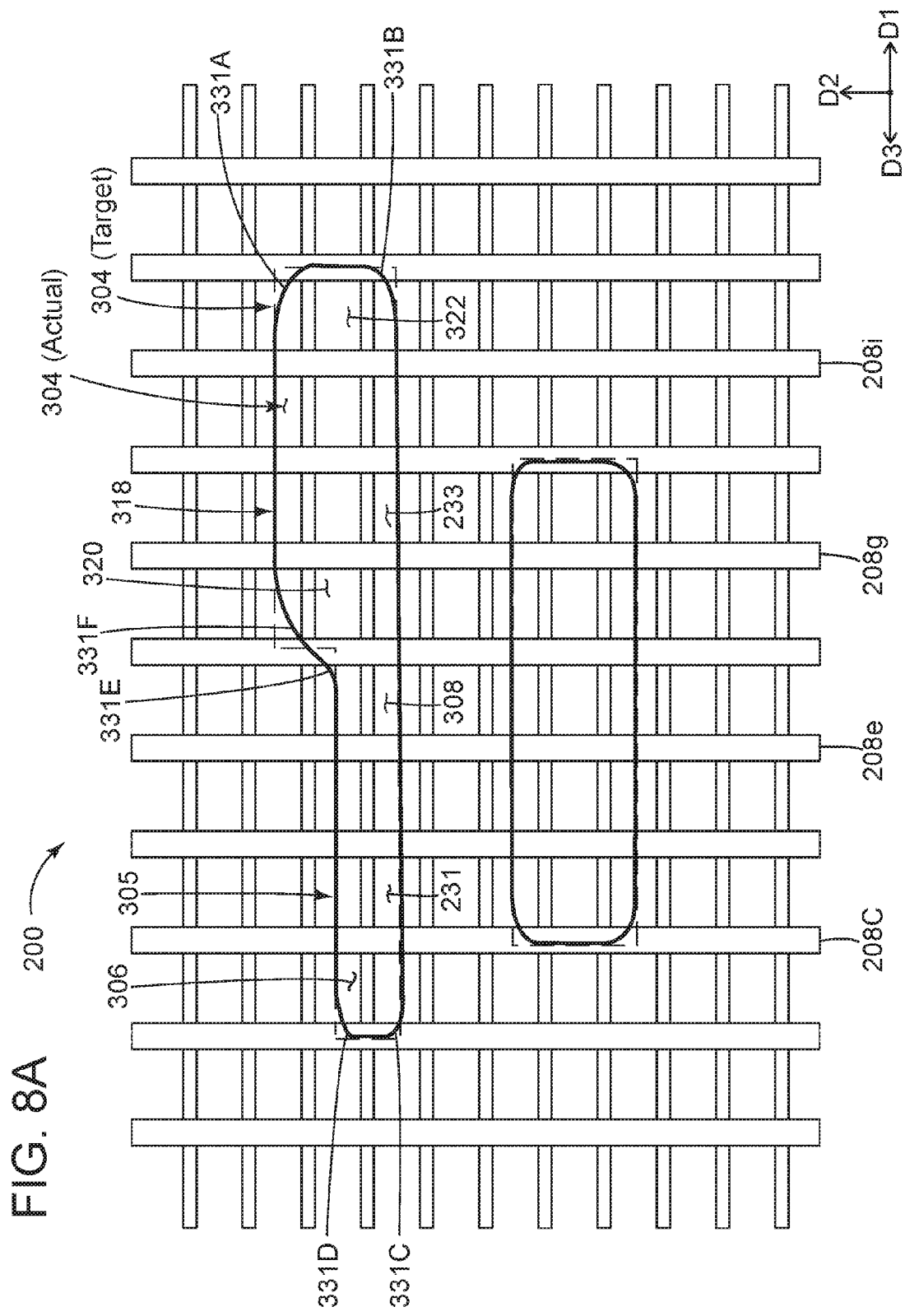

US 9,812,324 B1

METHODS TO CONTROL FIN TIP PLACEMENT

FIELD OF THE INVENTION

The present invention relates generally to semiconductor devices and methods of fabricating semiconductor devices, and more particularly, to methods of forming patterns for placement of fin tips on FinFETs.

BACKGROUND OF THE INVENTION

FinFET (fin field effect transistor) devices have become very popular in semiconductor device manufacturing because of the increased integration levels they provide. FinFET devices utilize arrays of parallel fins formed over the surface of a substrate to provide increased surface area relative to planar semiconductor devices. The fins are generally formed of semiconductor material such as silicon and extend longitudinally over the surface of the substrate. FinFET devices include field effect transistors or the like, which are formed on the fins. The added surface area provided by the fins is used as the channel and source/drain regions of the FinFET devices. Other active devices also utilize the additional area afforded by the fins. A greater number of FinFET devices than planar transistors can be produced on a given footprint area of a substrate. Further, for a given footprint area on a substrate, a FinFET transistor can be formed to include larger source/drain areas, larger channel areas and larger gate areas than a comparable planar transistor formed on the substrate surface, thereby increasing the device speed for FinFETs. The fins are generally formed parallel to one another over a substrate for ease of manufacturing and due to limitations of photolithography and etching processes.

In the manufacture of FinFET devices, the fins are generally initially formed throughout a substrate of a semiconductor structure. The substrate includes active areas where the FinFET devices will be utilized and inactive areas where they are not needed. The fins are subsequently removed from the inactive areas where they are not needed. The removal of the fins from some areas but not others is susceptible to patterning problems that are associated with inherent properties of light and with non-uniformities and irregularities in various masks used to remove the fins from the inactive areas.

SUMMARY OF THE INVENTION

The present invention offers advantages and alternatives over the prior art by providing a method of forming patterns for placement of fin tips in a semiconductor structure. The patterns are less susceptible to lithographic resolution problems.

A method in accordance with one or more aspects of the present invention includes providing a semiconductor structure having a substrate, the substrate including a plurality of substantially parallel fins horizontally extending in D1 and D3 directions (see FIG. 2). A target layout pattern is determined, the target layout pattern overlaying active areas for a device train of devices to be disposed on the fins. The devices terminating in fin tips of the fins. The target layout pattern includes a first group of sections overlaying devices having more fins than any adjacent device and a second group of sections overlaying devices having less fins than any adjacent device. A first extended exposure pattern is patterned into the structure. The first extended exposure pattern includes extensions that extend sections of the first group toward adjacent sections of the first group. A second extended exposure pattern is patterned into the structure. The second extended exposure pattern includes extensions that extend sections of the second group toward adjacent sections of the second group. Portions of the first and second extended exposure patterns are combined to form a final pattern overlaying the same active areas as the target pattern.

Another method in accordance with one or more aspects of the present invention includes providing a semiconductor structure having a substrate. The substrate includes a plurality of fins horizontally extending in D1 and D3 directions. A target layout pattern overlaying active areas for a device train of devices to be disposed on the fins is determined. The target layout pattern includes a first group of sections overlaying devices having more fins than any adjacent device and a second group of sections overlaying devices having less fins than any adjacent device. A first extended exposure actual pattern is patterned into the structure. The first extended exposure actual pattern includes extensions that extend sections of the first group horizontally. A second extended exposure actual pattern is patterned into the structure. The second extended exposure actual pattern includes extensions that extend sections of the second group horizontally. Portions of the first and second extended exposure actual patterns are combined to form a final pattern overlaying the same active areas as the target pattern.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 8A is a top view of the structure of FIG. 8 having a second extended exposure actual pattern patterned from the second extended exposure target pattern according to aspects of the present invention;

DETAILED DESCRIPTION

Figure 1:
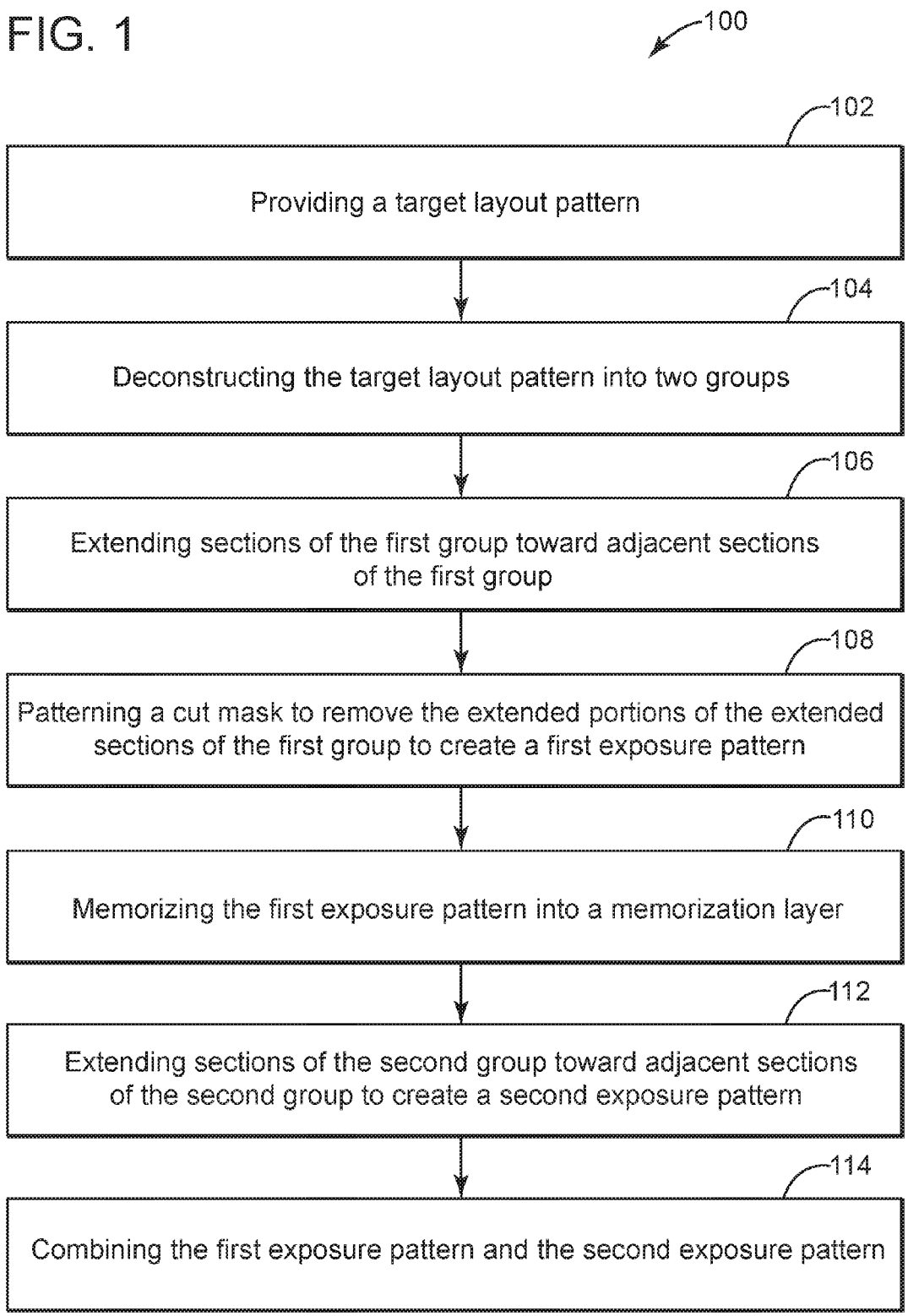
FIG. 1 is a flow diagram illustrating a method according to aspects of the present invention.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

Note also that reference is made below to the drawings, which are not drawn to scale for ease of understanding, wherein the same reference numbers used throughout different FIGS. designate the same or similar components. For the sake of clarity, only those elements and reference characters which are of relevance to the shown aspects of the respective embodiment of the present invention are shown repeatedly. In this regard, no attempt is made to show structural details of the invention in more detail than is necessary for a fundamental understanding of the invention, the description taken with the drawings making apparent to those skilled in the art how the several forms of the invention may be embodied in practice.

Unless defined otherwise, all technical and scientific terms used herein have the same meaning as commonly understood to one of ordinary skill in the art to which this invention belongs. Although any methods, devices or materials similar or equivalent to those described herein can be used in the practice or testing of the invention, the preferred methods, devices, and materials are now described.

In the process of fabricating a finFET, the end tips of all the fins need to be tucked under the gate to prevent epitaxial defects. Therefore, obtaining very good or precise control over fin tip placement is extremely important. Fin tip placement is determined by fin preserve patterns (or masks). Unfortunately, corner rounding of such fin preserve patterns due to resolution limitations causes the last active fin of the device to have much larger pullback away from where the gate will ultimately be formed than other fin tips defined by a vertical edge of the fin preserve mask.

In general, an exemplary method according to aspects of the present invention includes combining a first lithography-etch and cut process with a second lithography-etch process to a substrate of a semiconductor structure. Each lithography-etch (and optionally a cut) process defines a section of a designed fin-preserve mask. Optionally, the two resulting sections can be combined together to form a final preserve mask having significantly sharper corners (i.e., significantly reduced corner rounding) compared to that of a conventionally formed fin preserve mask. Alternatively, the two resulting sections can be overlaid. In an example embodiment, at least three masks are used: two preserve masks for the first and second litho-etch processes, and one for the cut mask, which removes a portion of the first preserve mask.

Referring to FIG. 1, a flow diagram is presented illustrating method 100 according to aspects of the present invention.

For clarity, each of steps 102-114 of method 100 will be described in reference to FIGS. 2-8.

Figure 2:
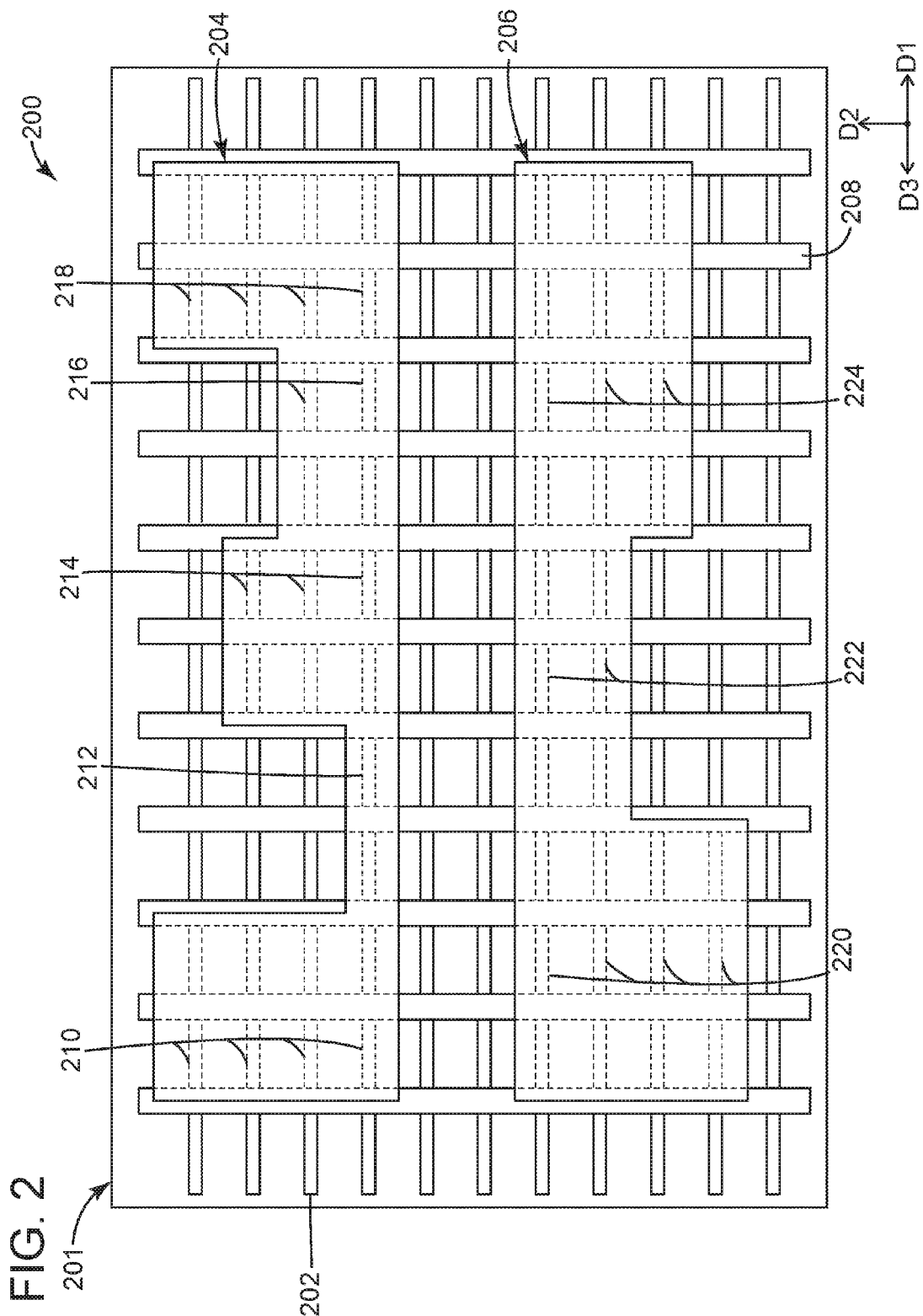
FIG. 2 is a top view of a structure depicting an example target layout pattern to apply an exemplary embodiment of a method according to aspects of the present invention.

Step 102 of method 100 shown in FIG. 1, which step corresponds to FIG. 2, is to provide a semiconductor structure 200 having a substrate 201 with a plurality of fins 202 running parallel to each other on the substrate 201. Target layout patterns (herein also referred to as "target layout designs"), for example top target layout pattern (or "design") 204 and lower target layout pattern (or "design") 206 are determined for optimal placement of active devices on the fins.

Referring to FIG. 2, a top view of structure 200 at an intermediate stage of its manufacturing process, just after formation of fins 202, is illustrated. It is important to note that, at this stage in the process flow, the gates 208 have not yet been formed. Rather, the gates 208 are illustrated to show the predetermined locations of those gates relative to the already formed fins 202. Additionally, at this stage of the process flow, the top and lower target layout patterns 204, 206 have not been patterned into the structure 200 nor has any active devices been formed in the fins 202 of structure 200. Rather, the target layout patterns 204, 206 are illustrated to show the predetermined locations of the active devices that the patterns 204, 206 will be utilize to form.

In FIG. 2, structure 200 is ready to go through processing and have semiconductor devices such as finFETs created upon it. For clarity, "horizontal" will be used to refer to direction D1 and opposite direction D3, both of which run parallel to fins 202 representing the direction of fins 202. The term "vertical" will be used to refer to direction D2, which is perpendicular to direction D1 and generally parallel to gates 208. The term "length" will be used as the dimension for horizontal distances in the D1 and D3 directions, and the term "width" will be used as the dimension for vertical distances in the D2 direction.

Also for clarity, the term "device" shall include traditional devices and device sections. A traditional device, as used herein, has only one active gate, such as a FinFET. A device section, as used herein, is a group of one or more traditional devices having the same number of fins which are horizontally aligned together. For example, a device on a substrate may be described as 4 fins wide, and 3 gates long taking into account the fin pitch and the gate pitch, respectively. Also, "2 CPP (critical poly pitch)" denotes a length because critical poly pitch is the pitch of the vertical gates 208.

The semiconductor fins 202 can be physically formed by patterning and etching on semiconductor substrate 201 of structure 200. Fins 202 may be of various dimensions, and fins 202 in the illustrated example include the same dimension and are separated by a constant pitch.

Structure 200 has at least one hardmask layer (not shown) over fins 202. The hardmask layer can be formed, for example, from silicon nitride, silicon oxide, silicon carbide, titanium nitride, or carbon based materials for typical etching processes. The hardmask layer can also be a hardmask stack of layers including, for example, one or more memorization layers. The layers of the hardmask stack may be etch selective from each and perform different functions during the process flow. For example, a hardmask memorization layer may be used to print (or memorize) portions of a pattern into it, wherein the memorized portions can be transferred down to lower hardmask layers later in the process flow to combined with other pattern portions in order to create a final pattern.

Target layout pattern 204 defines active areas of devices to be located on structure 200, and as such is a target layout pattern for a fin-preserve mask to be processed into structure 200. The active areas are provided primarily to indicate the location of the active areas and may or may not represent any physical processing that has already taken place on the structure 200 besides forming the plurality of fins 202 running parallel to each other. Further, it is to be understood that the shape of the active areas are not limited to the shapes depicted in FIG. 2. The gates 208 are not yet formed on structure 200 and are merely provided in the illustrations to give context to the positioning of the masks as will be described in more detail in later figures.

Still referring to FIG. 2, the structure 200 has two typical target layout designs, top target layout design 204 and lower target layout design 206 to illustrate how an example embodiment of a method according to aspects of the present invention can be applied to different target layout designs. Top target layout design 204 is depicted as overlaying a simple device train, i.e., a plurality of devices adjacent to each other in direction D1. Target layout design 204 overlays a device train having five devices: first device 210 having four fins, second device 212 having one fin, third device 214 having three fins, fourth device 216 having two fins, and fifth device 218 having four fins. The bottom target layout design is also depicted as a simple device train, but overlays a device train having only three devices: first device 220 having four fins, second device 222 having two fins, and third device 224 having three fins. For brevity, the application of method 100 to top target layout pattern 204 will be described only, however the application of method 100 to bottom target layout pattern 206 will be illustrated accordingly.

Still referring to step 102 in FIG. 1, in this example embodiment, a target layout design must conform to certain constraints. The constraints include: 1) that the termination device or commencement device of a device train cannot have an adjacent device wider (i.e., having more fins) than the termination or commencement device; 2) that the device train cannot have staggered tapered devices; and, 3) that the device train cannot have a sequence of devices create a staircase shape with a middle device. These constraints will be described in further detail in reference to FIGS. 10-12.

Figure 3:
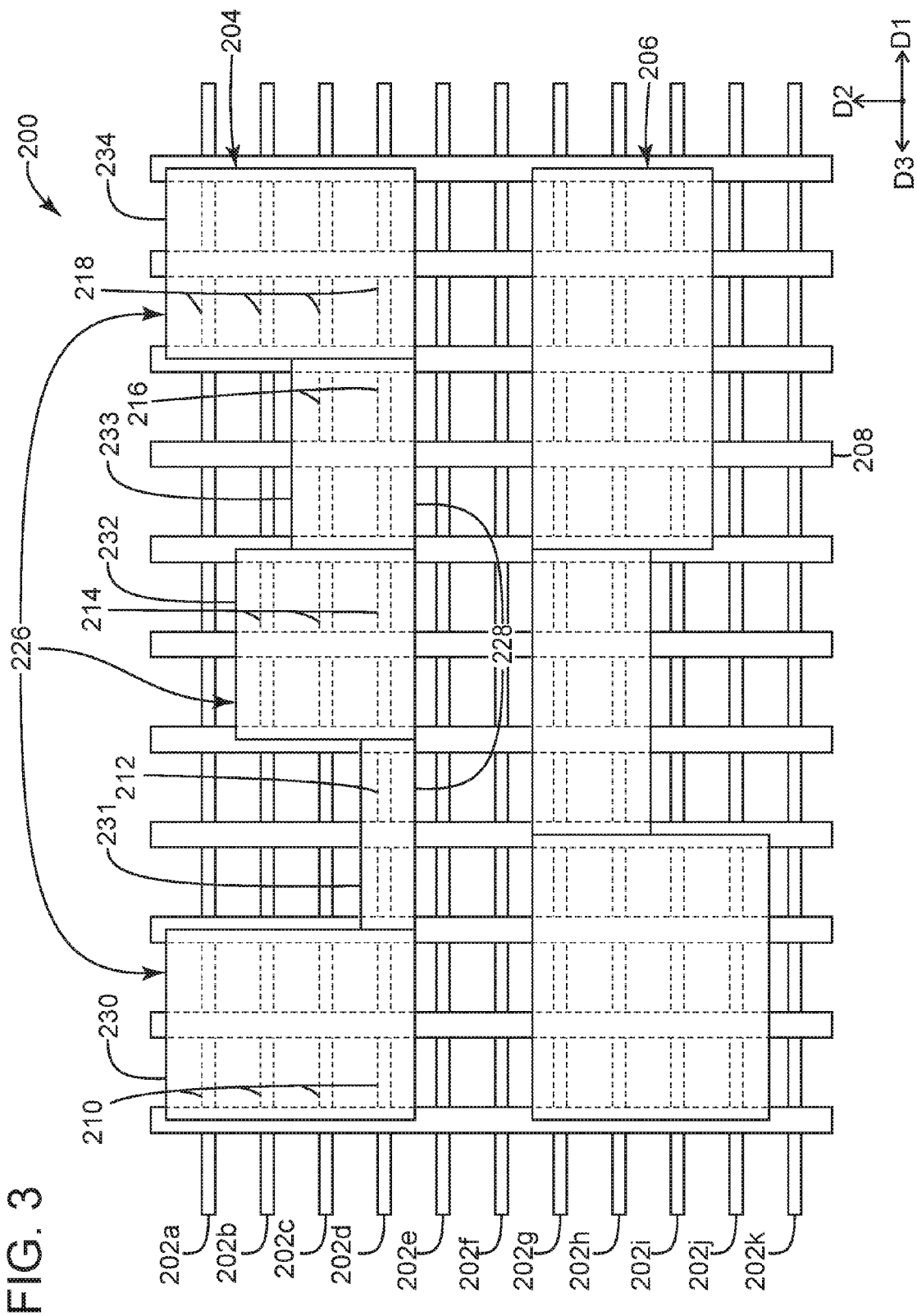
FIG. 3 is a top view of the structure of FIG. 2 having the target layout pattern deconstructed into first and second groups of sections according to aspects of the present invention.

Referring to FIG. 3, step 104 in FIG. 1 has been applied to the target layout design in FIG. 2. Step 104 is to deconstruct (as, for example, by mathematical calculation or computer program) target layout design 204 into a first group 226 of sections and a second group 228 of sections. In an exemplary embodiment, each section overlays only one device or dummy device. The first group 226 of these sections is determined by choosing the sections that overlay devices of the device train that have more fins 202 than any adjacent devices. The first group 226 of sections for target layout design 204 includes sections 230, 232, and 234 (which overlay devices 210, 214, and 218, respectively, as shown in FIG. 2). The second group 228 is determined by choosing the sections that overlay devices having less fins 202 than any adjacent devices. The second group 228 of sections for target layout design 204 includes sections 231, and 233 (which overlay devices 212, and 216, respectively, as shown in FIG. 2).

Applying step 104 from FIG. 1 to design target layout 204 in FIG. 2 to get the deconstructed design target layout 204 shown in FIG. 3, the first device 210, or commencing device 210, (overlain by section 230) is adjacent to second device 212 (overlain by section 231). First device 210 has more fins 202 (i.e., fin 202*a*, fin 202*b*, fin 202*c*, and fin 202*d*, for a total of 4 fins) than second device 212 (i.e., fin 202*d*, for a total of 1 fin). Therefore, section 230 of the deconstructed design target layout 204 in FIG. 3, becomes the first section of the first group 226 of sections because section 230 covers a device having more fins than the device corresponding to section 231. Similarly, third device 214 (overlain by section 232) is adjacent to second device 212 (overlain by section 231) and fourth device 216 (overlain by section 233). Third device 214 has 3 fins (202*b*, 202*c*, and 202*d*), while second device 212 has 1 fin (202*d*) and fourth device 216 has 2 fins (202*c* and 202*d*). Thus, section 232 overlays a device having more fins 202 than the devices immediately adjacent corresponding to sections 231, 233, which makes section 232 the second section of the first group 226. Fifth device 218 (overlain by section 234) is the third section in first group 226 because it covers a device having 4 fins 202*a*-202*d* while section 233 covers a device having only 2 fins 202*c* and 202*d*.

As it follows, choosing the sections for the second group 228 of sections is determined in the same way, except that the second group 228 of sections overlay devices that have less fins than immediately adjacent devices. Section 231 overlays a device having less fins 202 than the immediately adjacent devices overlaid by sections 230 and 232; and, section 233 overlays a device having less fins 202 than the immediately adjacent devices overlaid by sections 232 and 234 as was explained above. Therefore, section 231 becomes the first section of second group 228, and section 233 becomes the second section of second group 228.

This results in the relatively wide sections of the first group 226 (i.e., sections 230, 232, and 234) alternating with the relatively narrow sections in the second group 228 (i.e., sections 231 and 233) over the device train. As will be discussed in greater detail herein, the first and second groups 226 and 228 will be processed in two separate lithographic processes. The processed groups will then be combined to create a final fin preserve mask overlaying the device train with little or no rounded corners, which will result in better or more precise control of fin tip placement then prior art fin preserve masks.

Figure 4:
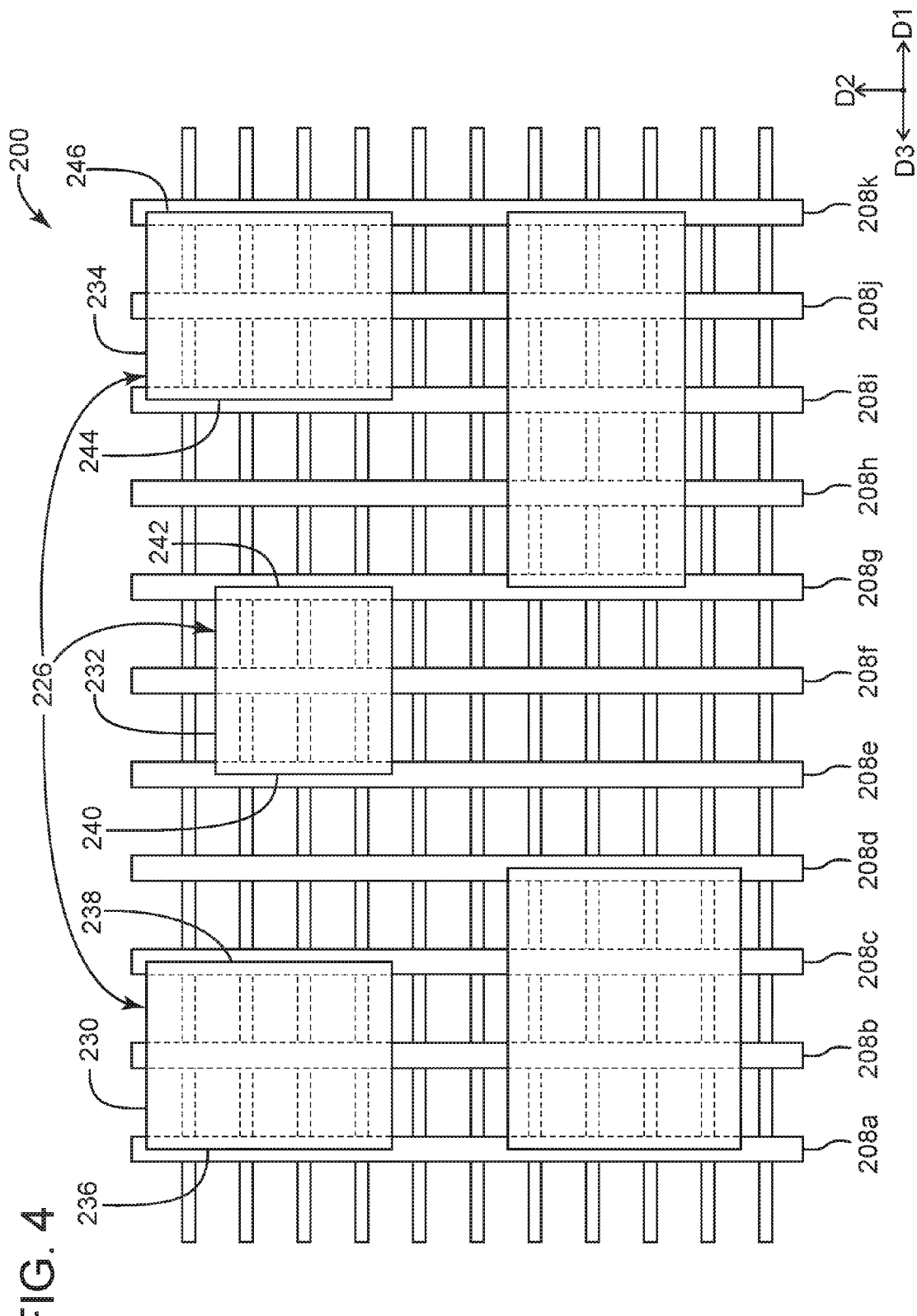
FIG. 4 is a top view of the structure of FIG. 3 having the first group of sections isolated from the second group of sections according to aspects of the present invention.

Referring to FIG. 4, the first group of sections 226 (shown in FIG. 3) are isolated from the second group of sections 228. First group 226 includes first section 230, second section 232, and third section 234. It is important to note that sections 230, 232 and 234 still depict desired targets of active regions and are not yet formed into structure 200. As such, it is important that the predetermined location of vertical edges of each section overlay a gate (or critical gate area) so that the fins can be tucked under the actual gates once formed. In this example embodiment, gates 208a-208k are not yet formed and are only shown for placement references. First section 230 has commencing vertical edge 236 aligned and overlaying gate (or critical gate area) 208a, and terminating edge 238 aligned and overlaying gate 208c. Second section 232 has commencing vertical edge 240 aligned and overlaying gate 208e, and terminating edge 242 aligned and overlaying gate 208g. Third section 234 has commencing vertical edge 244 aligned and overlaying gate 208i, and terminating edge 246 aligned and overlaying gate 208k.

Though the target sections 230, 232 and 234 are designed with perfectly square corners that are perfectly aligned within the center of their associated critical gate areas, if the sections were actually formed via conventional lithographic processes, the corners would all be rounded due to lithographic resolution limitations. Such rounded corners would also round (or pull back) the tips of the fins that those corners define. In some cases, this pull back can actually draw the fin tips out from under the critical gate area, causing a degradation in device performance. Accordingly, the subsequent steps in the process flow of the present invention are designed to eliminate or greatly reduce those rounded corners.

Figure 5:
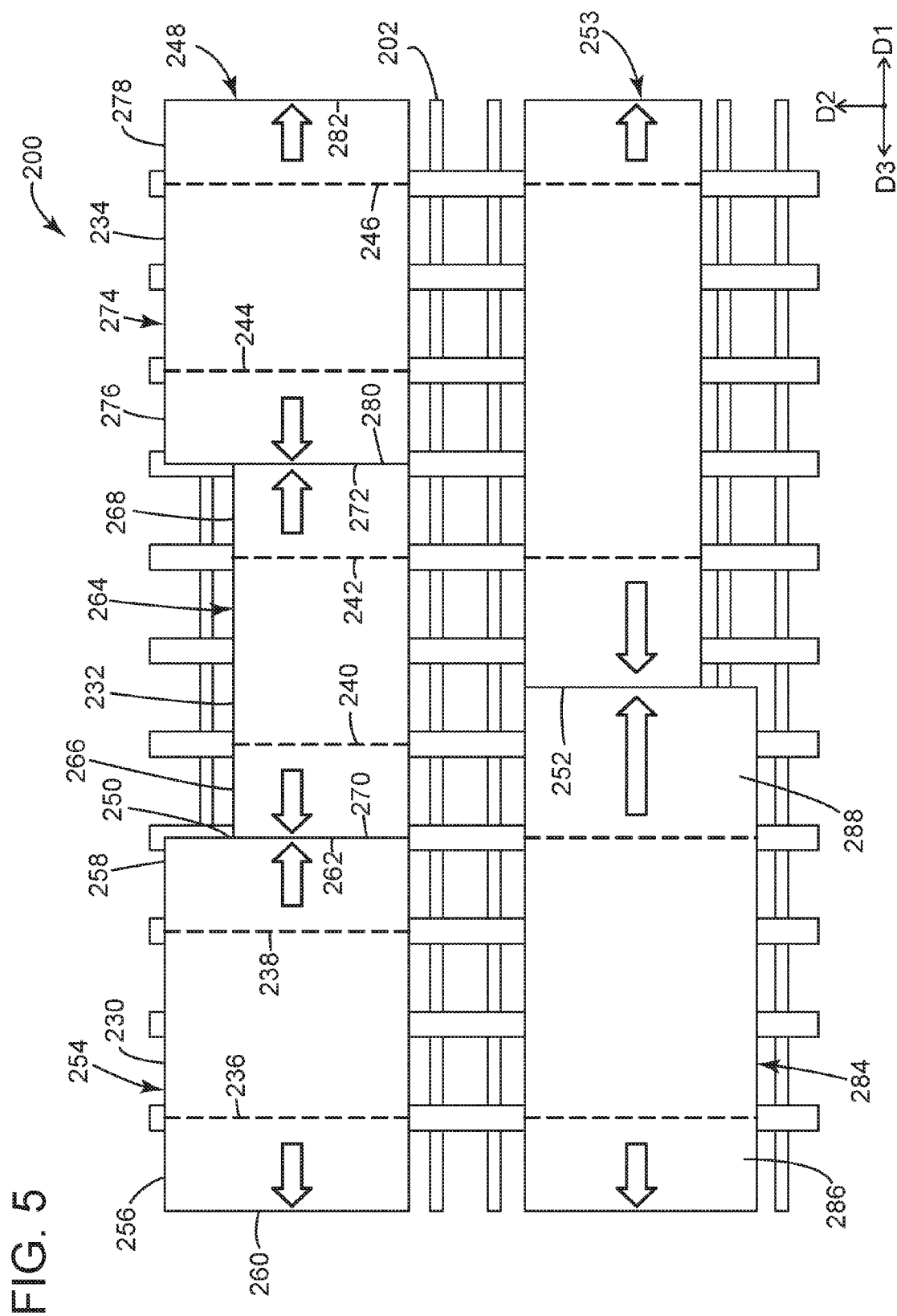
FIG. 5 is a top view of the structure of FIG. 4 having a first extended exposure target pattern, created from extensions of the first group of sections, disposed thereon according to aspects of the present invention.

Referring to FIG. 5, step 106 of FIG. 1 is applied to the isolated first group of sections illustrated in FIG. 4. Step 106 is to extend (as, for example, by mathematical calculation or computer program) the vertical (in the D2 direction) edges of sections 230, 232, 234 of the first group 226 (labelled in FIG. 3) horizontally (in the D1 and D3 directions) such that any rounded corners due to lithographic resolution would lay outside of the critical gate areas (i.e., the areas under the gates 208 where the fin tips of devices such as 210, 212 and 218 terminate). As such, the vertical edges of sections 230, 232, 234 are extended toward adjacent sections of the first group to create a first extended exposure target pattern 248.

Figure 5A:
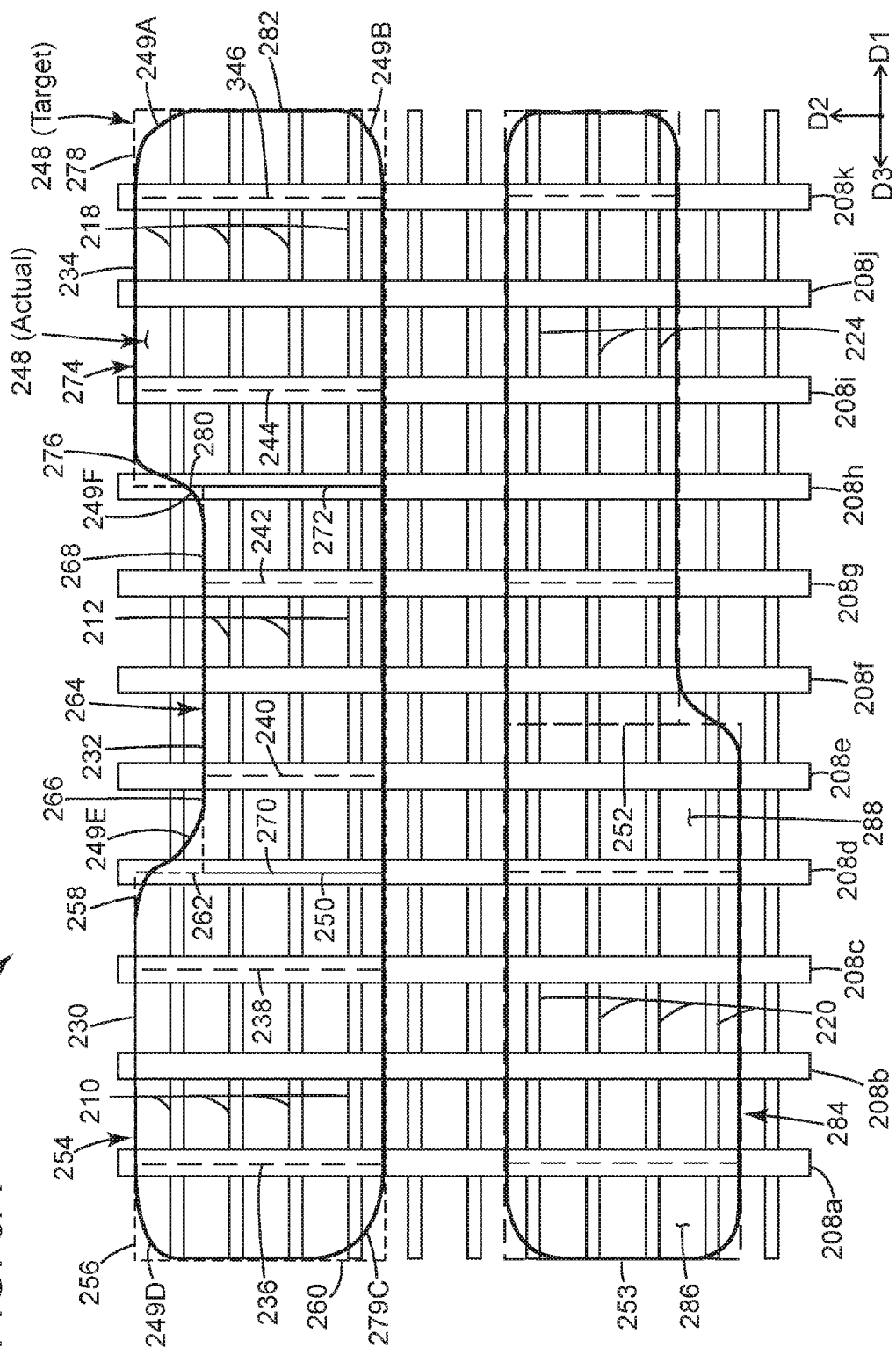
FIG. 5A is a top view of the structure of FIG. 5 having a first extended exposure actual pattern patterned from the first extended exposure target pattern according to aspects of the present invention.

Referring to FIG. 5A, the first extended exposure target pattern 248 is then patterned through well-known methods into structure 200 to form the first extended exposure actual pattern 248. By way of example, the actual pattern 248 could be patterned into a memorization layer of a hardmask stack covering the fins 202 of structure 200. The difference between the target pattern 248 and the actual pattern 248 is that the actual pattern 248 has rounded corners 249A through 249F formed due to lithographic limitations.

Importantly however, the rounded corners 249A-249F lay outside of the critical gate areas associated with the devices that the extended exposure pattern 248 covers. More specifically, actual pattern 248 covers the devices 210, 212, and 218, which originally had their fin tips defined by the vertical edges 236, 238, 240, 242, 244 and 246 of sections 230, 232 and 234 respectively. Those vertical edges are aligned respectively along the centerlines of the gates 208a, c, e, g, i and k, which represent the critical gate areas that the fin tips of devices 210, 212 and 218 must be tucked. None of the rounded corners 249A-249F of actual pattern 248 lay over any of those critical gate areas 208a, c, e, g, i and k due to the horizontal lengths of the extensions 256, 258, 266, 268, 276, 278 of target pattern 248.

The lengths of the extensions 256, 258, 266, 268, 276, 278 must be long enough so that the rounded corners 249A-249F lay significantly outside the critical gate areas 208a, c, e, g, i and k taking into consideration worst case tolerance conditions. Worst case tolerance conditions can include such factors as: the technology node one is working in, the specific integration scheme, lithographic resolution issues, choice of materials and other like factors. Additionally, if after determining the minimum required lengths of the extensions the space between adjacent extensions ends up being too small for lithographic resolution of the technology node, then the extensions may be extended still further so that they are merged together.

In the particular exemplary embodiment illustrated, the vertical edges 262, 270, 272 and 280 of the extended sections of the first extended exposure target pattern 248 merge halfway between the adjacent original, or non-extended, sections 230, 232, 234 of the first group 226 of sections. They merge halfway regardless of whether they merge over a gate, such as at interface 250 or between gates 208 such as at interface 252 in second extended exposure pattern 253.

The vertical edges are merged because, in this particular case, the predetermined minimum lengths of the extensions 258, 266, 268 and 276 would leave a space between them that would be too small for the lithographic resolution of this technology node. However, one skilled in the art would recognize that in other embodiments (such as in other technology nodes) the extensions do not have to be merged.

The commencing and terminating vertical edges of the original, non-extended sections 230, 232, 234 of the first group 226 are labeled and shown in dashed lines in FIGS. 5 and 5A for clarity only. They do not denote a break in the respective contiguous extended sections.

Applying step 106 in FIG. 1, first extended section 254 of FIGS. 5 and 5A includes original first section 230, with commencing extension 256 and terminating extension 258. Commencing extension 256 extends original commencing vertical edge 236 to extended commencing vertical edge 260. Terminating extension 258 extends original terminating vertical edge 238 to extended terminal vertical edge 262. Second extended section 264 includes original second section 232, with commencing extension 266 and terminating extension 268. Commencing extension 266 extends original commencing vertical edge 240 to extended commencing vertical edge 270. Note that where extended terminal vertical edge 262 and extended commencing vertical edge 270 meet, the boundary interface 250 is defined. Terminating extension 268 extends original terminating vertical edge 242 to extended terminal vertical edge 272. Third extended section 274 includes original first section 234, with commencing extension 276 and terminating extension 278. Commencing extension 276 extends original commencing vertical edge 244 to extended commencing vertical edge 280. Terminating extension 278 extends original terminating vertical edge 246 to extended terminal vertical edge 282.

Each original section 230, 232, 234 of the first group of sections 226 (labelled in FIG. 3) must be extended for the length that is determined by the need to prevent corner rounding caused by lithographic processing from affecting the final fin preserve pattern. In other words, the sections 230, 232, 234 must be extended by a length that moves any rounded corners out of any critical gate areas. In this particular exemplary embodiment, the minimum length of the extensions has been determined to be at least 1 CPP in each of direction D1 and D3, the direction opposite D1. Of course, one skilled in the art would recognize that the minimum lengths are dependent upon many factors and will vary from embodiment to embodiment.

The sections 230, 232, 234 must be extended by at least the minimum length (in this case by 1 CPP) regardless of whether there is an adjacent section of the first group or not.

For example, commencing extension 256 of first extended section 254 has a length of 1 CPP despite the original first section 230 not having an adjacent section in direction D3. In lower extended design 253, extended section 284 has commencing extension 286 with a length of 1 CPP because there is not an adjacent section in direction D3. However, extended section 284 has terminating extension 288 with a length of 1.5 CPP towards the adjacent original section (which covers device 224) in order to merge the adjacent original sections (which cover devices 220, 224) of lower target layout pattern 206. This merger of the adjacent original sections of pattern 206 was done because if the minimum length of 1 CPP for this exemplary embodiment were used, then the space between the extended adjacent sections would be too small for the lithographic resolution of this technology node. Of course, extensions have the potential to be more than 1.5 CPP depending on the target layout design.

Figure 6:
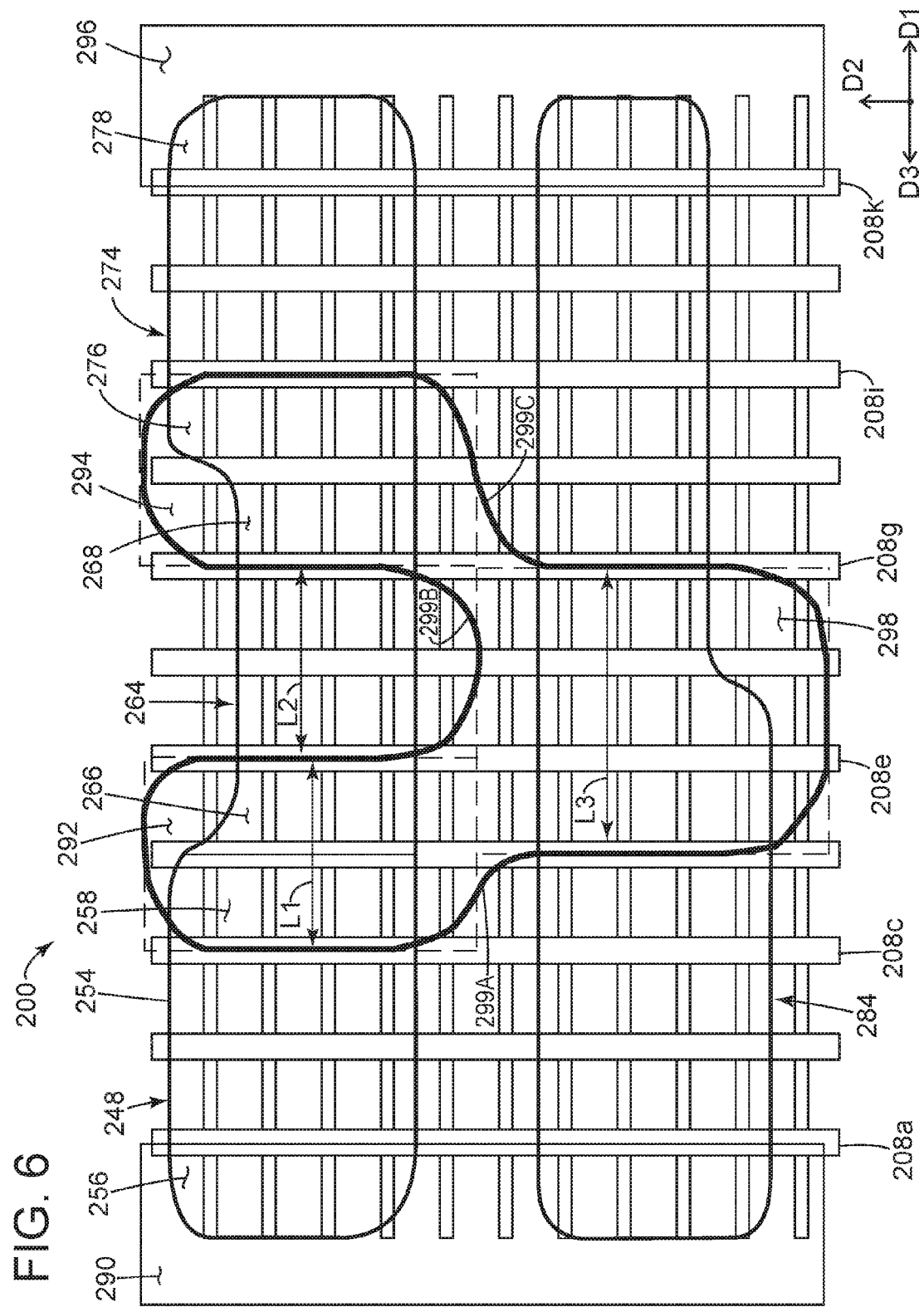
FIG. 6 is a top view of the structure of FIG. 5 having cut-masks disposed over the extensions of the first extended exposure actual pattern according to aspects of the present invention.

Referring to FIG. 6, the application of step 108 of method 100 shown in FIG. 1 is applied to the extended exposure pattern shown in FIGS. 5 and 5A. At this stage of the process flow, the top and lower extended exposure actual patterns 248, 253 are patterned into structure 200, and more specifically patterned into the hardmask stack overlaying fins 202 of structure 200. Step 108 is to remove from the hardmask stack only the actual extensions 256, 258, 266, 268, 276, 278 from the first extended exposure actual pattern 248 to create a first exposure pattern that will be memorized into the same or a different underlying layer of the hardmask stack covering fins 202. The extensions are removed by using cut-masks 290, 292, 294, and 296.

While up to this point mask regions and section areas have been used to show areas in which to preserve what is underneath, the regions of the cut-masks in FIG. 6 are used to show areas in which to remove what is underneath. In other words, regions of the cut-masks are illustrated as being over and "covering" a corresponding extension of actual pattern 248, however it should be understood that cut-masks 290, 292, 294, 296 represent a lithography process that will remove the hardmask area under the cut mask, e.g. with a positive tone development preprocess. In other words, in the positive photomask that includes the cut-mask regions, the portions of the photomask other than the cut-mask regions, are opaque. A develop process or develop and etching processes are then used to remove the portions of the extended exposure pattern 248 (in FIGS. 5 and 5A) that correspond to what is "covered" by the cut-mask regions to produce a first exposure pattern 300 with sharp edges (best seen in FIG. 7).

Still referring to FIG. 6, cut masks 290, 292, 294 and 296 must cover a region that fully covers the extensions 256, 258, 266, 268, 276, 278 with enough extra overlapping margin to account for process variation and overlay in the D1, D3 directions and a width that is larger than the width of the associated exposed extensions of pattern 248 in the D2 direction. In FIG. 6, cut-mask 292 has length L1 equal to 2 CPP. In the bottom design, cut-mask 298 has length L3 equal to 3 CPP, which corresponds to the length of the extensions described in FIG. 5. This sizing of the cut masks is necessitated by the printing of the actual cut-mask pattern having curved lines 299A 299B and 299C, resulting in rounded corners more so than the rectangular shape of the theoretically perfect target cut masks. Even with the rounded corners, however, the exposed portions of pattern 248 will be cut having sharp corners because the curves (as exemplified by curves 299A, 299B and 299C) of the rounded corners resulting from the actual printed cut-masks has ended and is a straight vertical line by the time it is cutting the pattern 248.

Figure 7:
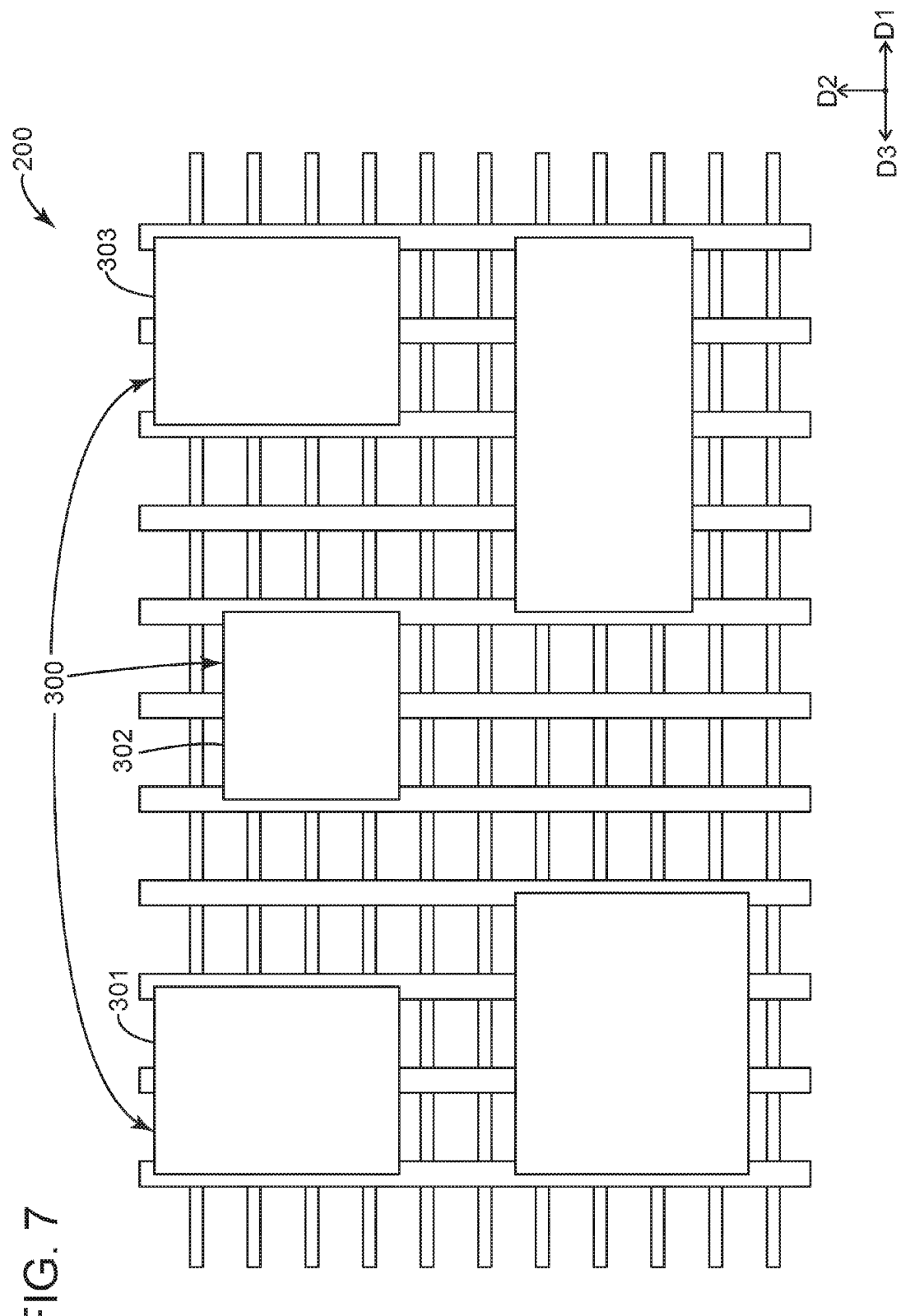
FIG. 7 is a top view of the structure of FIG. 6 having the extensions removed to form a first exposure pattern according to aspects of the present invention.

Referring to FIG. 7, first exposure pattern 300, which is a portion of the first extended exposure pattern 248 (labelled in FIGS. 5 and 5A), is illustrated with sharp (e.g., substantially square) corners, effectively with zero corner rounding. FIG. 7 corresponds to step 110 in FIG. 1. An etching step is used in conjunction with the cut-mask shown in FIG. 6 covering the cut-region in order to memorize first exposure pattern 300 into the hardmask layer (not shown) beneath the photoresist layer (not shown). The hardmask, or "memorization layer", can be, for example, silicon nitride. First exposure pattern 300 includes memorized areas 301, 302, and 303.

Figure 8:
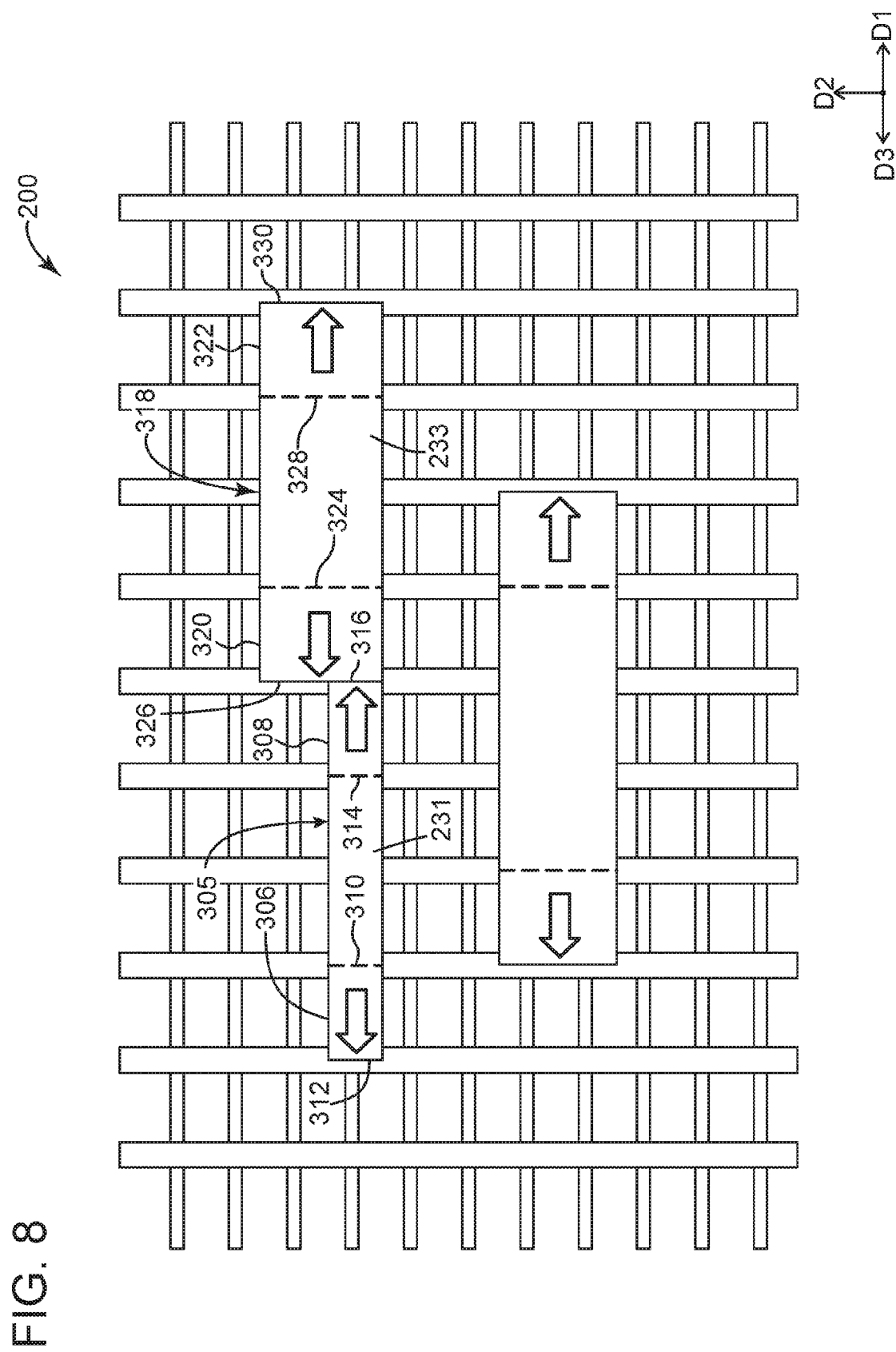
FIG. 8 is a top view of the structure of FIG. 7 without the first exposure pattern, and having a second extended exposure target pattern, created from extensions of the second group of sections, disposed thereon according to aspects of the present invention.

Referring to FIG. 8, step 112 is depicted: extending sections 231, 233 of the second group 228 (labelled in FIG. 3) of sections horizontally (in the D1, D3 directions) to create second extended exposure target pattern 304. This is the same as was done to the first group 226 of sections in step 106 applied in FIG. 5.

First extended section 305 of FIG. 8 includes original section 231, with commencing extension 306 and terminating extension 308. Commencing extension 306 extends original commencing vertical edge 310 to extended commencing vertical edge 312. Terminating extension 308 extends original terminating vertical edge 314 to extended terminal vertical edge 316. Second extended section 318 includes original second section 233, with commencing extension 320 and terminating extension 322. Commencing extension 320 extends original commencing vertical edge 324 to extended commencing vertical edge 326. Terminating extension 322 extends original terminating vertical edge 328 to extended terminal vertical edge 330.

Each original section of the second group of sections must be extended for a minimum extension that is determined by the requirements of preventing the corner rounding from affecting the fin tip placement, in each of direction D1 and D3 regardless of whether there is an adjacent section of the second group of sections or not. For example, commencing extension 306 of first extended section 305 has, in this exemplary embodiment, a length of 1 CPP despite the original first section 231 not having an adjacent section belonging to the second group in direction D3.

Referring to FIG. 8A, the second extended exposure target pattern 304 may be memorized into another hardmask layer, or provided on a photoresist layer to form the second extended exposure actual pattern 304. Like the first extended exposure target and actual patterns 248, the difference between the second extended exposure target pattern 304 and the actual pattern 304 is that the actual pattern will have rounded corners 331A-F, which will inherently be caused by lithographic processing.

Figure 9:
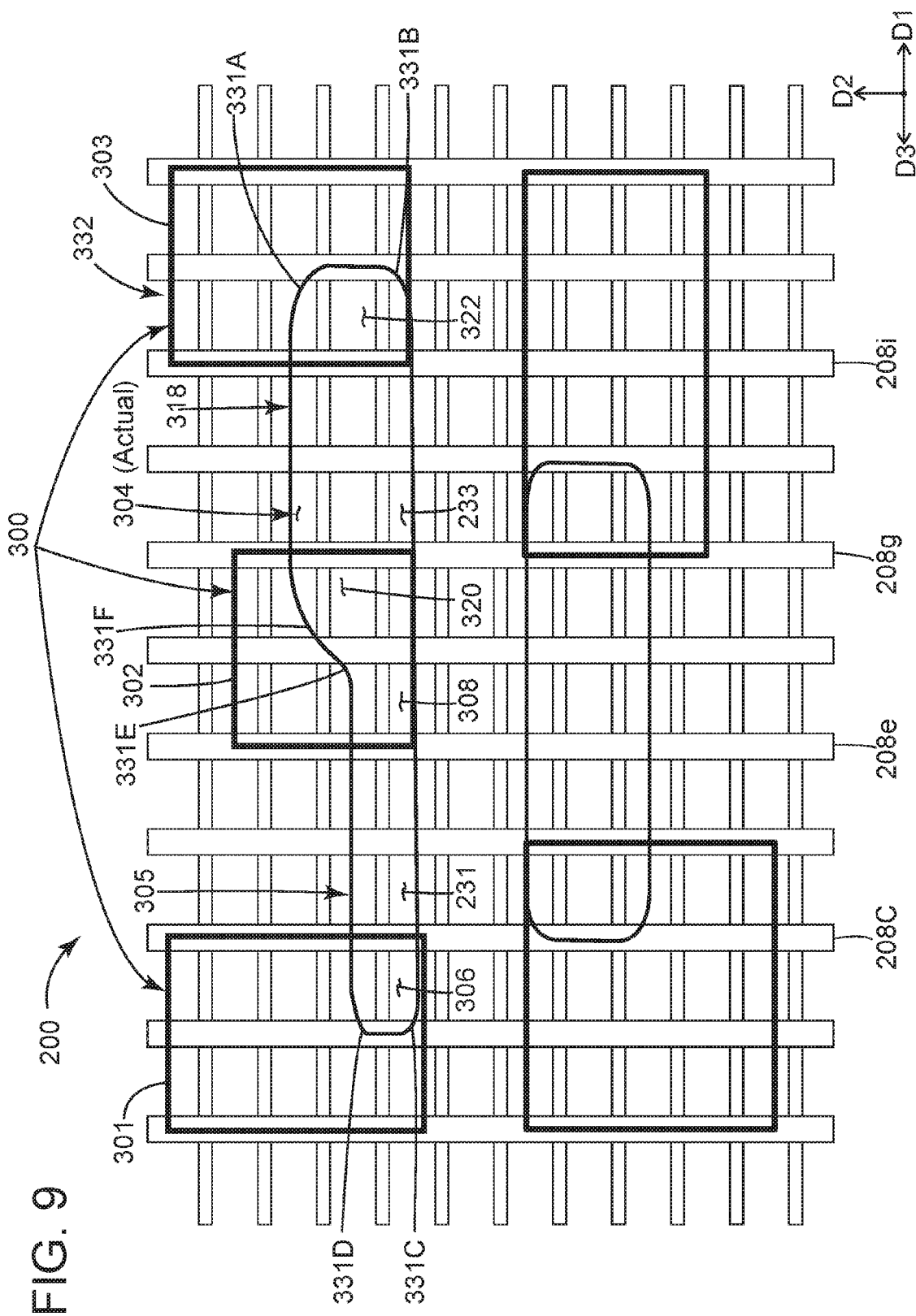
FIG. 9 is a top view of the structure of FIG. 8 depicting a final mask pattern resulting from combining the first exposure pattern and second extended exposure actual pattern according to aspects of the present invention.

Referring to FIG. 9, step 114 in FIG. 1 is depicted: combining the first exposure pattern 300 (shown in FIG. 7) having memorized areas 301, 302, and 303, with the second extended exposure pattern 304 (shown in FIG. 8) having extended sections 305 and 318 to get final pattern 332. In this exemplary embodiment, the first exposure pattern 300 (i.e., the first extended exposure pattern 248 with extensions 256, 258, 266, 268, 276, 278 trimmed off) and second extended exposure pattern 304 may be combined by a well-known process of being stitched together. Alternatively, the first exposure pattern 300 and second extended exposure pattern 304 may be combined by various other well-known processes such as patterning, etching or the like. The second extended exposure pattern 304 has to overlap the first exposure pattern 300 such that a minimum length of each end of each extended sections 305, and 318 of the second group 228 is covered by a memorized section of the first exposure pattern 300.

More specifically, the length of the extensions 306, 308, 320, 322 associated with the second extended exposure pattern 304 must be such that the rounded corners 331A-F are outside of the critical gate areas 208c, e, g, i and fully overlap an associated memorized section 301, 302, 303 of the first exposure pattern 300. It is important to note that the purpose of the original grouping of sections into alternating sections of a wide group 226 and narrow group 228, was to ensure that the sections of the first exposure pattern 300 were always wider than the sections of the second extended exposure pattern 304. Accordingly, the rounded corners 331A-F in extensions 306, 308, 320, 322 would always be covered by the sections of the first exposure pattern 300. As discussed earlier, the first exposure pattern 300 and second extended exposure pattern 304 may be combined through a variety of well-known flow processes (such as patterning, etching or the like) to trim off the rounded corners and form a final preserve mask 332. Advantageously, this grouping process eliminates the need for an additional cut mask to trim the rounded corners of the second extended exposure pattern 304.

For example, section 301 of first exposure pattern 300 (shown in FIG. 7), covers commencing extension 306 of extended section 305 of the second extended exposure pattern 304. Further, section 302 of first exposure pattern 300 covers terminating extension 308 of extended section 305, and covers commencing extension 320 of extended section 318. Finally, section 303 of first exposure pattern 300 covers terminating extension 322 of extended section 318. This ensures that all outer corners of the second extended exposure pattern 304 are tucked under the first exposure pattern 300. This can be done by "stitching" the patterns 300, 304 together, or simply overlaying the photomasks containing the patterns 300, 304, depending on whether the second extended exposure pattern 304 was memorized into another hardmask layer or provided on another photoresist layer.

Combining the patterns 300, 304 enables the final pattern 332 to be printed with sharp corners instead of rounded corners, leading to a more accurate conversion of the target layout pattern 204 into an actual physical final pattern 332 (or fin preserve mask 332).

Figure 10:
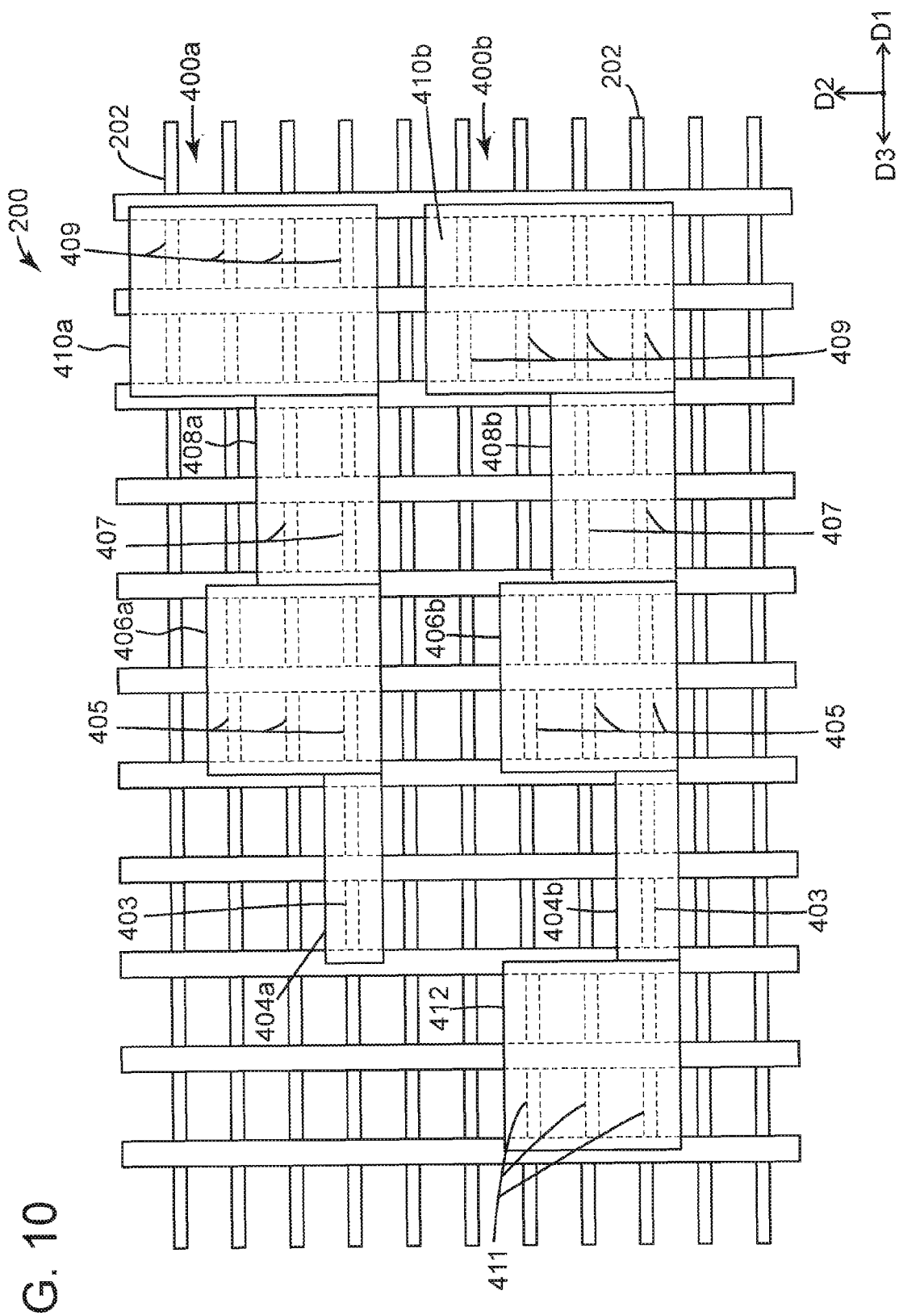
FIG. 10 is a top view of a structure depicting a first constraint, that a device train must not be terminated with a narrow device, on a target layout pattern for an exemplary embodiment of a method according to aspects of the present invention.
Figure 11:
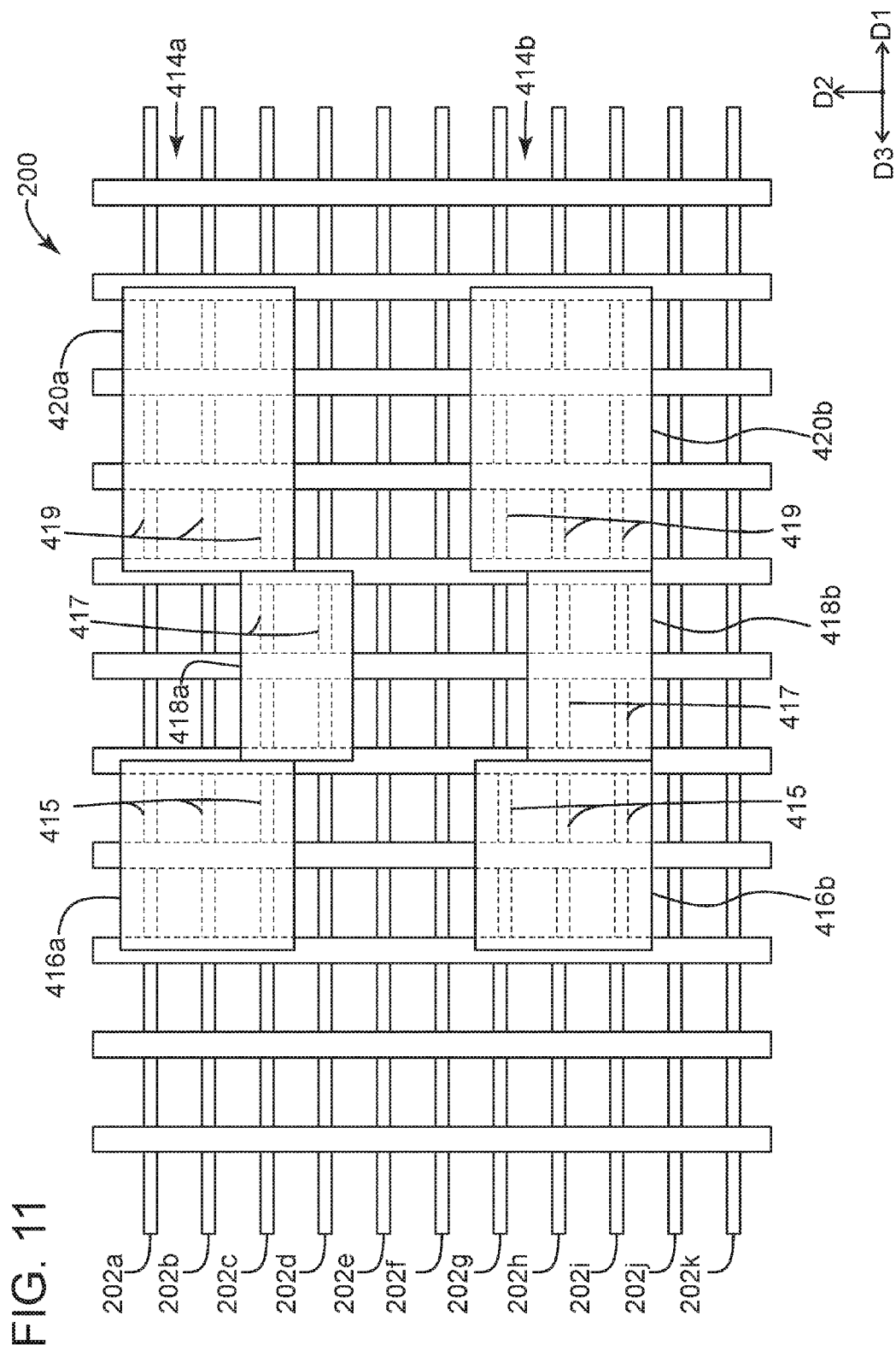
FIG. 11 is a top view of a structure depicting a second constraint, that no staggered devices are allowed, on a target layout pattern for an exemplary embodiment of a method according to aspects of the present invention.
Figure 12:
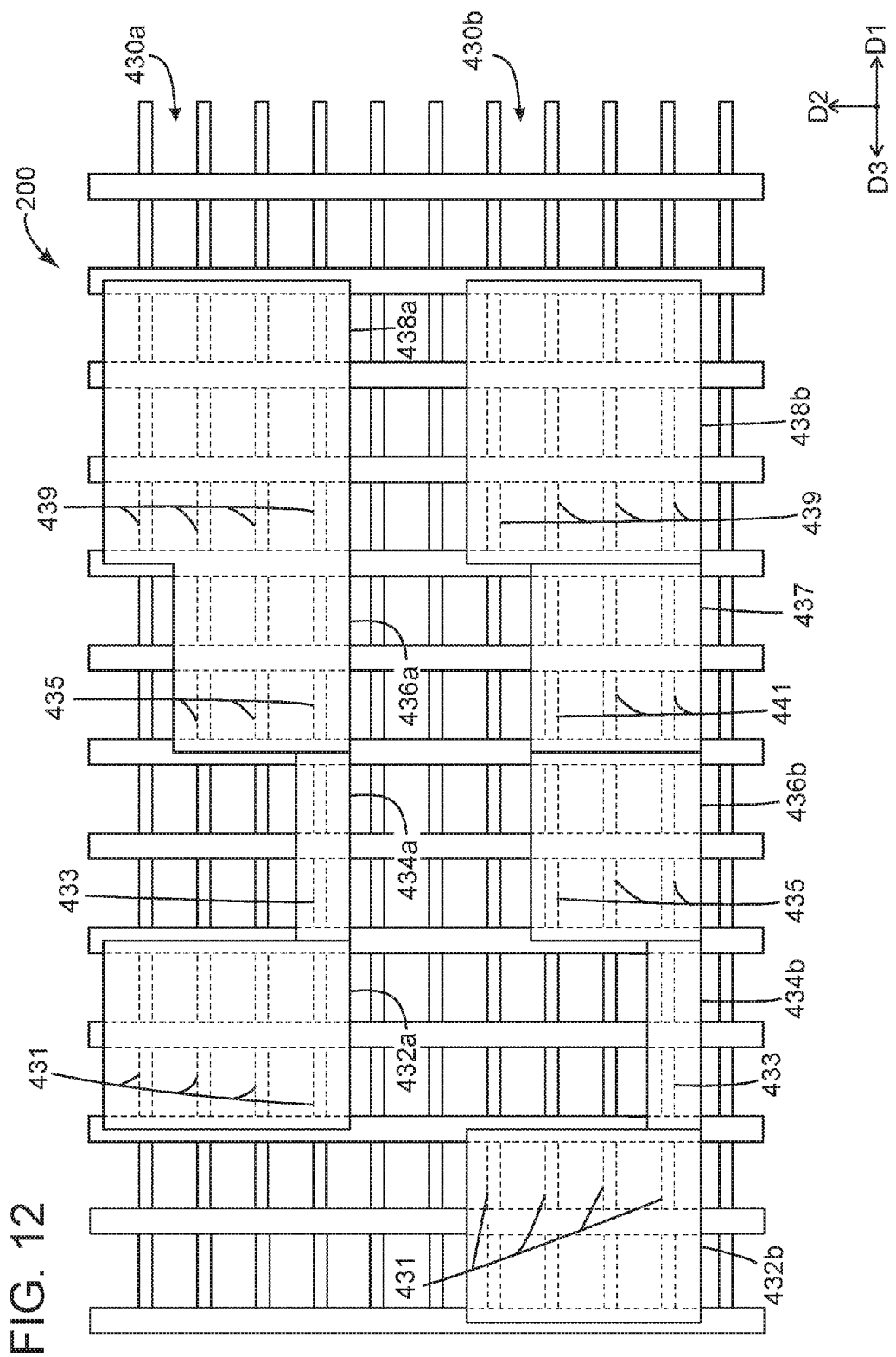
FIG. 12 is a top view of a structure depicting a third constraint that a staircase pattern is not allowed, on a target layout pattern for an exemplary embodiment of a method according to aspects of the present invention.

FIGS. 10-12 represent three basic modifications to the original method 100 (previously described with reference to FIGS. 1-9), wherein a target layout pattern overlaying a device train cannot be readily categorized into a first wide group 226 of sections alternating with a second narrow group 228 of sections per method 100. These modifications to method 100 are due to problems caused by violations of certain specific constraints imposed on a device train in order to properly apply method 100. More specifically, there are three basic constraints that will be discussed, which include:

a first constraint, wherein a device train must not be terminated with a narrow device (as illustrated in FIG. 10);

a second constraint, wherein a device train must not contain a staggered device (as illustrated in FIG. 11); and a third constraint, wherein a device train cannot include a middle device that forms a middle staircase shaped pattern (as illustrated in FIG. 12).

As will be shown, even when one or more of these constraints are violated, the method 100 can be modified and applied to provide a final fin preserve mask (or final pattern) with sharp corners in accordance with the present invention. Further, the modified method 100 can advantageously be applied such that no additional cut mask is required to trim rounded corners of a second extended exposure pattern in order to obtain the final pattern.

Referring to FIG. 10, a device train that is terminated by a narrow device 403 is illustrated. In order to properly apply method 100, a device train must include the first constraint that the termination device or commencement device of the device train cannot have an adjacent device wider than the termination or commencement device. In other words, sections of the first wider group 226 (such as you would define in accordance with the deconstructing of the target layout design step 104 and best seen in FIG. 2), must include the sections that overlay the commencement device and the termination device. Conversely, a section of the second narrow group 228 (best seen in FIG. 2) can never overlay a device at the start or end a device train. The term "commencement device" is used to mean the first device of a device train, while "termination device" is used to mean the last or final device of the device train.

In FIG. 10, there is top target layout pattern 400a, which overlays a device train that violates the first constraint, and a bottom target layout pattern 400b, which does not violate the first constraint. Top target layout pattern 400a has first section 404a overlaying first device 403, second section 406a overlaying second device 405, third section 408a overlaying third device 407, and fourth section 410a overlaying fourth device 409. If we deconstruct top pattern 400a according to step 104 in method 100 (shown in FIG. 1), it becomes clear that first section 404a, along with third section 408a, will be designated as sections of the second group, i.e., sections covering devices having less fins 202 than any adjacent devices. As such, second section 406a and fourth section 410a are designated as sections of the first group, i.e., sections overlaying devices having more fins 202 than any adjacent devices. Since the commencement first device 403 is adjacent to wider second device 405, then top pattern 400a overlays a device train that violates the first constraint.

The first constraint exists because the extensions of the second narrow group of sections must be covered by the sections in the first wide group of sections to prevent corner rounding from the narrow extensions affecting the final fin preserve mask and, therefore, fin tip placement. If the desired structure is such that a narrower device starts a device train, like in the device train overlain by top target pattern 400a in FIG. 10, then the target pattern must be designed to include a dummy device 411 wider than the desired starting narrower device 403 configured adjacent to the desired starting narrower device 403 in direction D3. Bottom target layout pattern 400b demonstrates this strategy.

Bottom target layout pattern 400b has first section 412 overlaying a dummy device 411, second section 404b overlaying device 403, third section 406b overlaying device 405, fourth section 408b overlaying device 407 and fifth section 410b overlaying device 409. Sections 404b, 406b, 408b and 410b of bottom layout 400b cover the same devices as sections 404a, 406a, 408a and 410a, respectively, of top layout 400a. Thus, if the desired structure is top pattern 400a, then the target layout pattern must be designed like bottom pattern 400b with first section 412 overlaying dummy device 411. Dummy device 411 is not restricted to a width of three fins as is illustrated in FIG. 10. Dummy device 411 can have any width larger than adjacent device 405 overlain by section 404b. Further, first device 411 does not have to be a dummy device.

Referring to FIG. 11, a device train having a staggered device 417 is illustrated. In order to properly apply method 100, a device train cannot include a staggered device 417, wherein one of the narrow group of devices has a bottom fin that is literally vertically (in the D2 direction) below the bottom fins of the adjacent wider devices 415 and 419.

More specifically, FIG. 11 illustrates the second constraint in that the device train cannot have staggered tapered devices. This is because the constituent sections of the first wide group are chosen so that they can cover the fins 202 that are covered by the extension of the constituent sections of the second narrow group. In a staggered configuration, a portion of the extension of the second narrow group cannot be fully covered by the sections in first wide group. Note that this staggered constraint also applies to narrow devices that have a top fin vertically above the top fins of adjacent wide devices.

In FIG. 11, top target layout pattern 414a has first section 416a overlaying device 415, second section 418a overlaying device 417, and third section 420a overlaying device 419. Second device 417 is a staggered tapered device because it includes fin 202d, which is not included in either of devices 415 or 419.

In contrast, a modified bottom target layout pattern 414b has sections 416b, 418b, and 420b overlaying the same devices 415, 417 and 419 respectively. Because the device 417 has been repositioned vertically upward, it is no longer staggered and pattern 414b does not overlay a device train which violates the second constraint.

Referring to FIG. 12, a device train having a middle staircase shaped pattern is illustrated. In order to properly apply method 100, a device train cannot have a sequence of devices that create a staircase shape with the middle stair. In the situation of a staircase shape, the middle stair does not fall into the definition of the first group (i.e., devices that are wider than both adjacent devices) since the top stair is wider than the middle stair, nor does it fall into the definition of the second group (i.e., devices that are narrower than both adjacent devices) since the bottom stair is narrower than the middle stair.

In FIG. 12, top target layout pattern 430a has first section 432a overlaying device 431, second section 434a overlaying device 433, third section 436a overlaying device 435 and fourth section 438a overlaying device 439. Sections 434a, 436a, and 438a create a staircase shape because device 433 has one fin, device 435 has three fins, and device 439 has four fins. Device 435 is the middle step. Thus, top pattern 430a overlays a device train that violates the third constraint.

If a staircase of devices is desired, in order to overcome this constraint, the target layout pattern should be designed with the middle stair sized at least 4 times the required minimum extension length so that it can be split into two parts that have lengths of at least 2 times the minimum extension length, as is shown in bottom target layout pattern 430b. In pattern 430b the alternating sequence of sections in the first wide group and sections in the second narrow group can be preserved. As such, to overcome the third restraint, the first group can be defined to include devices that are wider than or equal to adjacent devices, and the second group can be defined to include devices that are narrower than or equal to adjacent devices.

Bottom target layout pattern 430b, in FIG. 12, has first section 432b overlaying device 431, second section 434b overlaying device 433, third section 436b overlaying device 435, fourth section 437 overlaying dummy device 441, and fifth section 438b overlaying device 439. Sections 432b, 434b, 436b, and 438b, of bottom pattern 430b cover the same number of fins as sections 432a, 434a, 436a, and 438a, respectively, of top layout 430a. Fourth section 437 of bottom layout 430b overlays a dummy device 441 extending middle stair section 436a of the top layout to at least 4 times the required minimum extension length (which in this exemplary embodiment is 4 CPP) so that the middle stair shaped portion can be split into two sections, i.e., section 436b and section 437 both having a length of at least two times the minimum required extension length (which in this exemplary embodiment is 2 CPP). First section 432b, third section 436b, and section device 438b are designated as sections of the first wide group in the deconstruction step, while second section 434b and fourth section 437 are designated as sections of the second narrow group in the deconstruction step.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of one or more aspects of the invention and the practical application, and to enable others of ordinary skill in the art to understand one or more aspects of the invention for various embodiments with various modifications as are suited to the particular use contemplated. The corresponding structures, materials, acts, and equivalents of all means or step plus function elements in the claims below, if any, are intended to include any structure, material, or act for performing the function in combination with other claimed elements as specifically claimed.

What is claimed is:

1. A method comprising:
providing a semiconductor structure having a substrate, the substrate including a plurality of substantially parallel fins;
determining a target layout pattern overlaying active areas for a device train of devices to be disposed on the fins, the devices terminating in fin tips of the fins, the target layout pattern including a first group of sections overlaying devices having more fins than any adjacent device and a second group of sections overlaying devices having less fins than any adjacent device;
patterning a first extended exposure actual pattern into the structure, the first extended exposure actual pattern including extensions that extend sections of the first group toward adjacent sections of the first group;
patterning a second extended exposure actual pattern into the structure, the second extended exposure actual pattern including extensions that extend sections of the second group toward adjacent sections of the second group;
combining portions of the first and second extended exposure actual patterns to form a final pattern overlaying the same active areas as the target pattern; and
wherein the first group of sections overlays a commencement device located at a beginning of the device train and a termination device located at an end of the device train.

2. The method of claim 1 comprising:
utilizing a cut-mask to remove the extensions of the first extended exposure actual pattern to form a first exposure pattern over the structure; and,
combining the first exposure pattern with the second extended exposure actual pattern to form the final pattern.

3. The method of claim 2 comprising:
utilizing a plurality of cut mask regions of the cut mask to cover the extensions;
wherein each cut-mask region has a horizontal length substantially equal to or greater than a horizontal length of the extension it covers; and,
wherein each cut-mask region has a vertical width greater than a vertical width of the extension it covers.

4. The method of claim 2 comprising combining the first exposure pattern and the second extended exposure actual pattern to form the final pattern, wherein the final pattern is substantially absent of any rounded corners formed during patterning.

5. The method of claim 1 comprising:
determining locations of a plurality of substantially parallel gates to be extended vertically over the structure in a direction perpendicular to the fins, the gate locations overlaying critical gate areas where the fin tips terminate the devices;
determining the target layout pattern such that the first group of sections have vertical edges and square corners, the vertical edges disposed over the critical gate areas of the devices overlaid by the first group of sections; and
extending the vertical edges of the first group of sections horizontally to form extensions of a first extended exposure target pattern for patterning the first extended exposure actual pattern into the structure;
wherein the extensions of the first extended exposure target pattern have a minimum horizontal length sized such that any rounded corners formed into the extensions of the first extended exposure actual pattern during patterning lay outside of the critical gate areas of the devices overlaid by the first group of sections.

6. The method of claim 5 comprising utilizing a cut-mask to remove the extensions of the first extended exposure actual pattern to form a first exposure pattern over the structure.

7. The method of claim 6 comprising:
determining the target layout pattern such that the second group of sections have vertical edges and square corners, the vertical edges disposed over the critical gate areas of the devices overlaid by the second group of sections; and
extending the vertical edges of the second group of sections horizontally to form extensions of a second extended exposure target pattern for patterning the second extended exposure actual pattern into the structure;
wherein the extensions of the second extended exposure target pattern have a minimum horizontal length sized such that any rounded corners formed into the extensions of the second extended exposure actual pattern during patterning overlap the first exposure pattern.

8. The method of claim 7 wherein the extensions of the second extended exposure target pattern have a minimum horizontal length sized such that any rounded corners formed into the extensions of the second extended exposure actual pattern during patterning lay outside of the critical gate areas of the devices overlaid by the second group of sections.

9. The method of claim 1 wherein the device train does not include a staggered device.

10. The method of claim 1 wherein the device train does not include a device that forms a middle stair shaped pattern.

11. The method of claim 1 wherein the device train includes one of a commencement device and a termination device having an adjacent device that is wider than the one of the commencement device and termination device, the method comprising:
modifying the device train by disposing a dummy device adjacent the one of the commencement device and termination device that is wider than the one of the commencement device and termination device; and
determining the target layout pattern based on the modified device train.

12. The method of claim 1 wherein the device train includes a staggered device relative to its adjacent wider device, the method comprising:
modifying the device train to realign the staggered device such that it is no longer staggered relative to its adjacent wider devices; and
determining the target layout pattern based on the modified device train.

13. The method of claim 1 wherein the device train includes a middle device that forms a middle staircase shaped pattern, the method comprising:
modifying the device train by inserting a dummy device adjacent the middle device, the dummy device having the same number of fins as the middle device; and
determining the target layout pattern based on the modified device train.

14. The method of claim 13 wherein the middle stair shaped device and the dummy device have a combined length that is at least four times a required minimum extension length.

* * * * *